(12) United States Patent
Boniardi et al.

(10) Patent No.: US 11,922,056 B2
(45) Date of Patent: *Mar. 5, 2024

(54) NEURAL NETWORK MEMORY

(71) Applicant: Micron Technology, Inc., Boise, ID (US)

(72) Inventors: Mattia Boniardi, Cormano (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/977,046

(22) Filed: Oct. 31, 2022

(65) Prior Publication Data

US 2023/0058092 A1    Feb. 23, 2023

Related U.S. Application Data

(63) Continuation of application No. 16/503,015, filed on Jul. 3, 2019, now Pat. No. 11,487,464.

(51) Int. Cl.
*G11C 13/00* (2006.01)
*G06F 3/06* (2006.01)
(Continued)

(52) U.S. Cl.
CPC .......... *G06F 3/0655* (2013.01); *G06F 3/0604* (2013.01); *G06F 3/0673* (2013.01); *G06N 3/08* (2013.01); *G11C 11/54* (2013.01); *G11C 13/004* (2013.01); *G11C 13/0069* (2013.01); *G11C 13/0004* (2013.01); *G11C 2013/0047* (2013.01);
(Continued)

(58) Field of Classification Search
None
See application file for complete search history.

(56) References Cited

U.S. PATENT DOCUMENTS 7,904,398 B1    3/2011 Repici
10,325,651 B2    6/2019 Or-Bach et al.
(Continued)

FOREIGN PATENT DOCUMENTS

KR    10-2018-0062934 A    6/2018

OTHER PUBLICATIONS

Ambrogio, et al., "Unsupervised Learning by Spike Timing Dependent Plasticity in Phase Change Memory (PCM) Synapses", vol. 10, Article 56, Mar. 8, 2016, 12 pages.
(Continued)

*Primary Examiner* — Tan T. Nguyen
(74) *Attorney, Agent, or Firm* — Brooks, Cameron & Huebsch, PLLC

(57) ABSTRACT

An example apparatus can include a memory array and a memory controller. The memory array can include a first portion including a first plurality of memory cells. The memory array can further include a second portion including a second plurality of memory cells. The memory controller can be coupled to the first portion and the second portion. The memory controller can be configured to operate the first plurality of memory cells for short-term memory operations. The memory controller can be further configured to operate the second plurality of memory cells for long-term memory operations.

20 Claims, 10 Drawing Sheets

(51) Int. Cl.
*G06N 3/08* (2023.01)
*G11C 11/54* (2006.01)
*H10N 70/00* (2023.01)

(52) U.S. Cl.
CPC ........ *G11C 2213/30* (2013.01); *H10N 70/882* (2023.02)

(56) References Cited

U.S. PATENT DOCUMENTS

| | | | |
|---|---|---|---|
| 11,487,464 B2 * | 11/2022 | Boniardi | G06F 3/0673 |
| 2004/0243281 A1 | 12/2004 | Fujita | |
| 2013/0301338 A1 | 11/2013 | Kim et al. | |
| 2014/0369139 A1 * | 12/2014 | Van Winkelhoff | G11C 8/20 |
| | | | 365/194 |
| 2015/0106315 A1 | 4/2015 | Birdwell et al. | |
| 2015/0146472 A1 | 5/2015 | Kitagawa et al. | |
| 2016/0092353 A1 | 3/2016 | Swanson et al. | |
| 2018/0005107 A1 | 1/2018 | Neil et al. | |
| 2018/0197076 A1 | 7/2018 | Paik | |
| 2019/0065929 A1 | 2/2019 | Koelmans et al. | |
| 2019/0088301 A1 | 3/2019 | Maekawa | |
| 2019/0164600 A1 | 5/2019 | Castro | |
| 2019/0198105 A1 | 6/2019 | Pirovano | |

OTHER PUBLICATIONS

Ambrogio, et al., "Neuromorphic Learning and Recognition With One-Transistor-One-Resistor Synapses and Bistable Metal Oxide RRAM", IEEE Transactions on Electron Devices, vol. 63, No. 4, Apr. 2016, 8 pages.

U.S. Appl. No. 16/001,790, entitled "Weight Storage Using Memory Device", filed Jun. 6, 2018, 58 pages.

International Search Report and Written Opinion from related International PCT application No. PCT/2020/040279, dated Oct. 15, 2020, 10 pages.

* cited by examiner

NEURAL NETWORK MEMORY

PRIORITY INFORMATION

This application is a Continuation of U.S. application Ser. No. 16/503,015 filed on Jul. 3, 2019, the contents of which are incorporated herein by reference.

TECHNICAL FIELD

The present disclosure relates generally to apparatuses and methods related to neural network memory in a memory array.

BACKGROUND

The following relates generally to memory devices and more specifically to weight storage using a memory device. Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
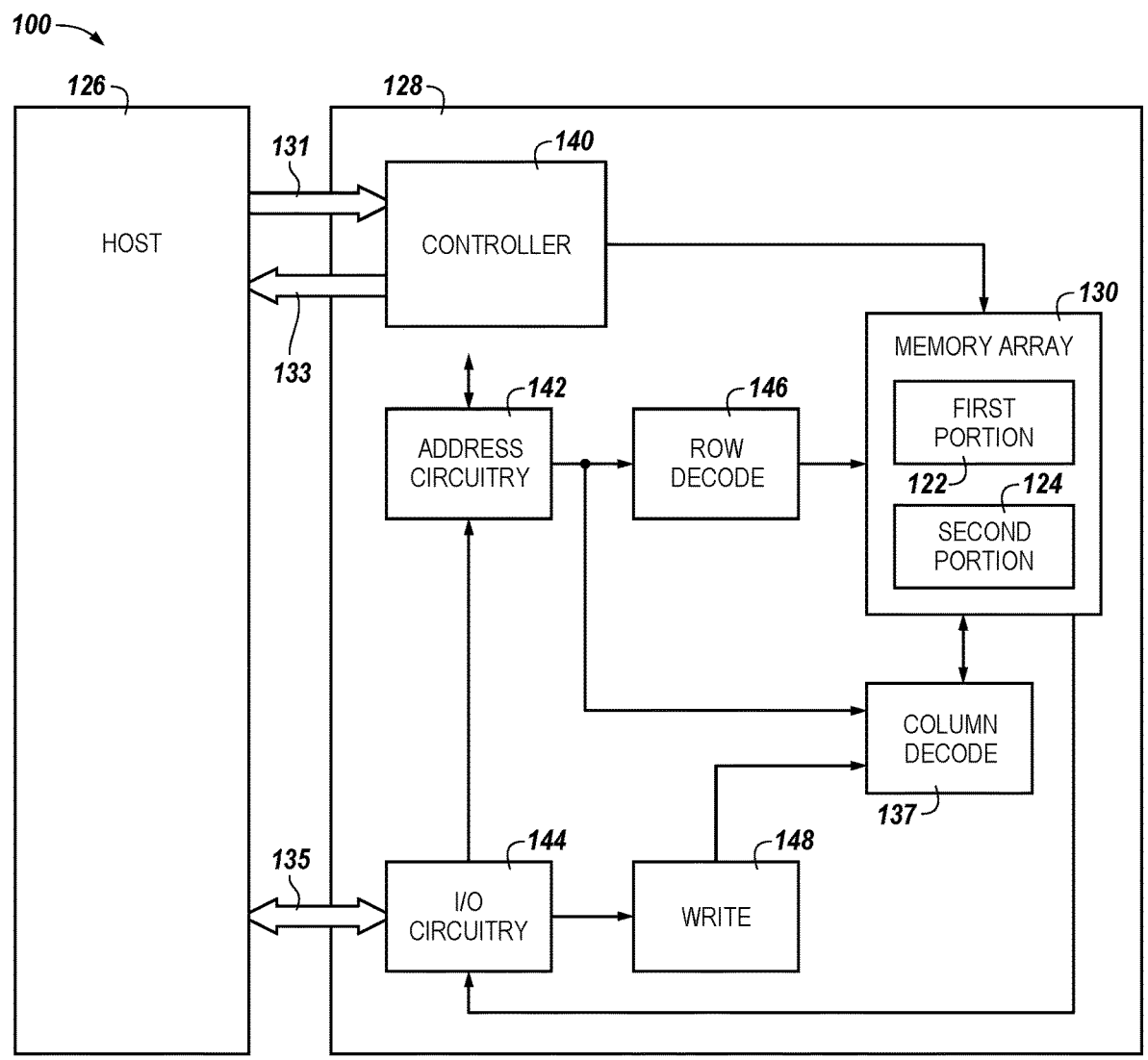
FIG. 1 illustrates an exemplary diagram of a memory system in accordance with embodiments of the present disclosure.

Examples of the present disclosure can include an apparatus. The example apparatus can include a memory array and a memory controller. The memory array can include a first portion including a first plurality of memory cells. The memory array can further include a second portion including a second plurality of memory cells. The memory controller can be coupled to the first portion and the second portion. The memory controller can be configured to operate the first portion for short-term memory operations. The memory controller can be further configured to operate the second portion for long-term memory operations.

Some neuromorphic systems may use resistive RAM (RRAM) such as PCM devices or self-selecting memory devices (as is described in association with FIGS. 2-3) to store a value (or weight) of a synapse (e.g., synaptic weight). Such variable resistance memory may include memory cells configured to store multiple levels and/or that may have wide sense windows. Such types of memory may be configured to perform training operations by pulse (e.g., spike) control. Such training operations may include spike-timing-dependent plasticity (STDP). STDP may be form of Hebbian learning that is induced by correlation between spikes transmitted between nodes (e.g., neurons). STDP may be an example of a process that adjusts the strength of connections between nodes (e.g., neurons).

In neural networks, a synaptic weight refers to the strength or amplitude of a connection between two nodes (e.g., neurons). The nature and content of information transmitted through a neural network may be based in part on the properties of connections, which represent synapses, formed between the nodes. For example, the property of the connections can be synaptic weights. Neuromorphic systems and devices, among others, may be designed to achieve results that may not be possible with traditional computer architectures. For example, neuromorphic systems may be used to achieve results more commonly associated with biological systems such as learning, vision or visual processing, auditory processing, advanced computing, or other processes, or a combination thereof. As an example, the synaptic weight and/or connections between at least two memory cells can represent a synapse, or a strength or degree of connectivity of the synapse and be associated with a respective short-term connection or a long-term connection, which corresponds to the biological occurrence of short-term and long-term memory. A series of neural network operations can be performed in order to increase the synaptic weight between the at least two memory cells in a short-term or a long-term fashion, depending on which type of memory cell is used, as will be described below.

A learning event of a neural network operation can represent causal propagation of spikes among neurons, enabling a weight increase for the connecting synapses. A weight increase of a synapse can be represented by an increase in conductivity of a memory cell. A variable resistance memory array (for example a 3D cross-point or self-selecting memory (SSM) array) can mimic an array of synapses, each characterized by a weight, or a memory cell conductance. The greater the conductance, the greater the synaptic weight and the higher the degree of memory learning. Short-term memory learning can be a fast and/or reversible memory learning where the analog weight of a synapse is enhanced, namely, its electrical conduction is increased by a reversible mechanism. Long-term memory learning can be a slow and/or irreversible memory learning where the cell conductance is irreversibly increased for a particular state (e.g., SET or RESET), leading to unforgettable memory coming from a longer, experience-dependent learning. As an example, a cell conductance increase due to performing forced write cycles on the long-term memory cells (to turn them into long-term memory cells) may be irreversible such that resetting the long-term memory cells results in a higher cell conductance than resetting the memory cells prior to performance of the forced write cycles. However, a cell conductance increase due to performing long-term memory operations on the already degraded long-term memory cells may be reversible upon reset.

Different memory cells (e.g., short-term memory cells or long-term memory cells) can be used to perform each associated type of memory learning operation. The memory cells can become short-term memory cells or long-term memory cells based on the operations described below. Reversible and irreversible degradation mechanisms can be used in variable resistance (e.g., chalcogenide-based) cross-point arrays to impact a conductivity of a cell which can represent the analog voltage at which the cell conducts (e.g., referred to as threshold voltage (Vt) below) and thus mimic the different methods of learning of biological neurons.

Systems, devices, and methods configured to mimic neuro-biological architectures that may be present in a nervous system and/or to store synaptic weights associated with long-term and short-term learning or relationships are described herein. A memory apparatus may include a memory array including a first portion and a second portion. The first portion of the memory array can include a first plurality of variable resistance memory cells and the second portion can include a second plurality of variable resistance memory cells. The second portion can be degraded through forced write cycling. The degradation mechanism can include damage to the chalcogenide material. In some embodiments that include memory cells comprised of material other than chalcogenide material, the degradation mechanism can include the thermal relationship between memory cells, control via control gate coupling between memory cells, a charge loss corresponding to the memory cells, a temperature induced loss of signal or threshold, etc.

The memory controller can be configured to operate the first portion for short-term memory operations. Operation of the first portion can include apply a plurality of pulses to the first plurality of memory cells. For example, the memory controller can apply a plurality of READ disturb pulses or short SET pulses in order to increase cell conductance of the first plurality of variable resistance memory cells in the first portion. Operation of the first plurality of memory cells can represent short-term learning. The memory controller can be configured to operate the second portion for long-term memory learning. Operation of the second portion during performance of long-term memory operations can include performing a plurality of READ disturb pulses or short SET pulses in order to increase cell conductance even further beyond the cell conductance caused by the degradation of the prior forced write cycle pulses. The second plurality of variable resistance memory cells can represent long-term learning. The long-term learning represented by the second portion can be caused by degradation of the second plurality of memory cells. The plurality of memory cells may, in some cases, be read in groups and synaptic weights can be detected and combined during a read operation.

Features of the disclosure introduced above are further described below in the context of a memory device in FIGS. 1-3 below. Specific examples are then described for a plurality of memory cells in FIG. 4A (short-term learning) and FIG. 4B (long-term learning). These and other features of the disclosure are further illustrated by and described with reference to apparatus diagrams, system diagrams, and flowcharts that relate to weight storage using a memory device.

FIG. 1 is a block diagram of an apparatus in the form of a computing system 100 including a memory device 128 in accordance with a number of embodiments of the present disclosure. As used herein, a memory device 128, controller 140, and memory array 130, might also be separately considered an "apparatus."

In this example, system 100 includes a host 126 coupled (e.g., connected) to memory device 128, which includes a memory array 130. Host 126 can be a host system such as a personal laptop computer, a desktop computer, a digital camera, a smart phone, or a memory card reader, among various other types of hosts. Host 126 can include a system motherboard and/or backplane and can include a number of processing resources (e.g., one or more processors, microprocessors, or some other type of controlling circuitry). The system 100 can include separate integrated circuits or both the host 126 and the memory device 128 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a self-selecting memory (SSM) array, a 3-dimensional (3-D) X-point memory array, STT RAM array, PCRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 128 may include a number of arrays 130 (e.g., a number of banks of NAND flash cells, etc.).

The memory device 128 includes address circuitry 142 to latch address signals provided over a bus 135 (e.g., an I/O bus) through I/O circuitry 144. Address signals are received through address circuitry 142 and decoded by a row decoder 146 and a column decoder 137 to access the memory array 130. The address signals can also be provided to controller 140 (e.g., via address circuitry 142 and/or via a control bus 131). Data can be read from memory array 130 by sensing voltage and/or current changes on the data lines using sensing circuitry (not illustrated). The sensing circuitry can read and latch a page (e.g., row) of data from the memory array 130. The I/O circuitry 144 can be used for bi-directional data communication with host 126 over the I/O bus 135. The write circuitry 148 is used to write data to the memory array 130.

Memory controller 140, which may be referred to as bank control logic and/or a sequencer, decodes signals provided by control bus 131 from the host 126. These signals can include chip enable signals, write enable signals, and address latch signals that are used to control operations performed on the memory array 130, including data read, data write, and data erase operations. In various embodiments, the controller 140 is responsible for executing instructions from the host 126 and sequencing access to the array 130. The memory controller 140 can be a state machine, a sequencer, or some other type of controller.

The memory controller 140 may control the operation (e.g., read, write, re-write, refresh, discharge) of memory cells through the various components, for example, row decoder 146, column decoder 137, etc. In some cases, one or more of the row decoder 146 and column decoder 137 may be co-located with the controller (e.g., memory controller) 140. Memory controller 140 may generate row and column address signals in order to activate the desired access line (e.g., access line 210 in FIG. 2) and sense line (e.g., sense line 215). Memory controller 140 may also generate and control various voltages or currents used during the operation of a memory array (e.g., memory array 201). In general, the amplitude, shape, polarity, and/or duration of an applied voltage or current discussed herein may be adjusted or varied and may be different for the various operations discussed in operating the memory array (201). Furthermore, one, multiple, or all memory cells within memory array 130 may be accessed simultaneously; for example, multiple or all cells of memory array 130 may be accessed simultaneously during a reset operation in which all memory cells, or a group of memory cells, are set to a single logic state.

The memory array 130 can include a first portion 122 of a plurality of memory cells and a second portion 124 of a plurality of memory cells. The first portion 122 can be programmed in a particular way such that the first portion 122 is used to represent short-term memory learning. As an example, the first portion 122 can be unprogrammed initially when performing a plurality of neural network operations on the first portion 122 of cells. A plurality of short-term memory operations can include programing the short-term memory cells a particular number of times using a read disturb (for SSM memory) or a short SET pulsing (for 3D cross-point memory). Each of the short-term memory operations can increase a synaptic weight associated with each of the cells of the first portion 122. The short-term learning of the first portion 122 can be reversible.

The second portion 124 can be pulsed using forced write cycling in a particular way such that the second portion 124 is used to represent long-term memory learning. The forced write cycling can be performed prior to performing long-term memory operations on the memory cells in the second portion 124 being used as long-term memory cells. A particular number of forced write cycles can be performed on the second portion 124 to mimic long-term learning. Subsequent to the forced write cycling, a plurality of long-term memory operations can be performed on the cells of the second portion 124 in order to increase a synaptic weight associated with each of the cells of the second portion 124. The long-term learning of the second portion 124 can be irreversible, as will be described further in association with FIGS. 2-4B below.

Figure 2:
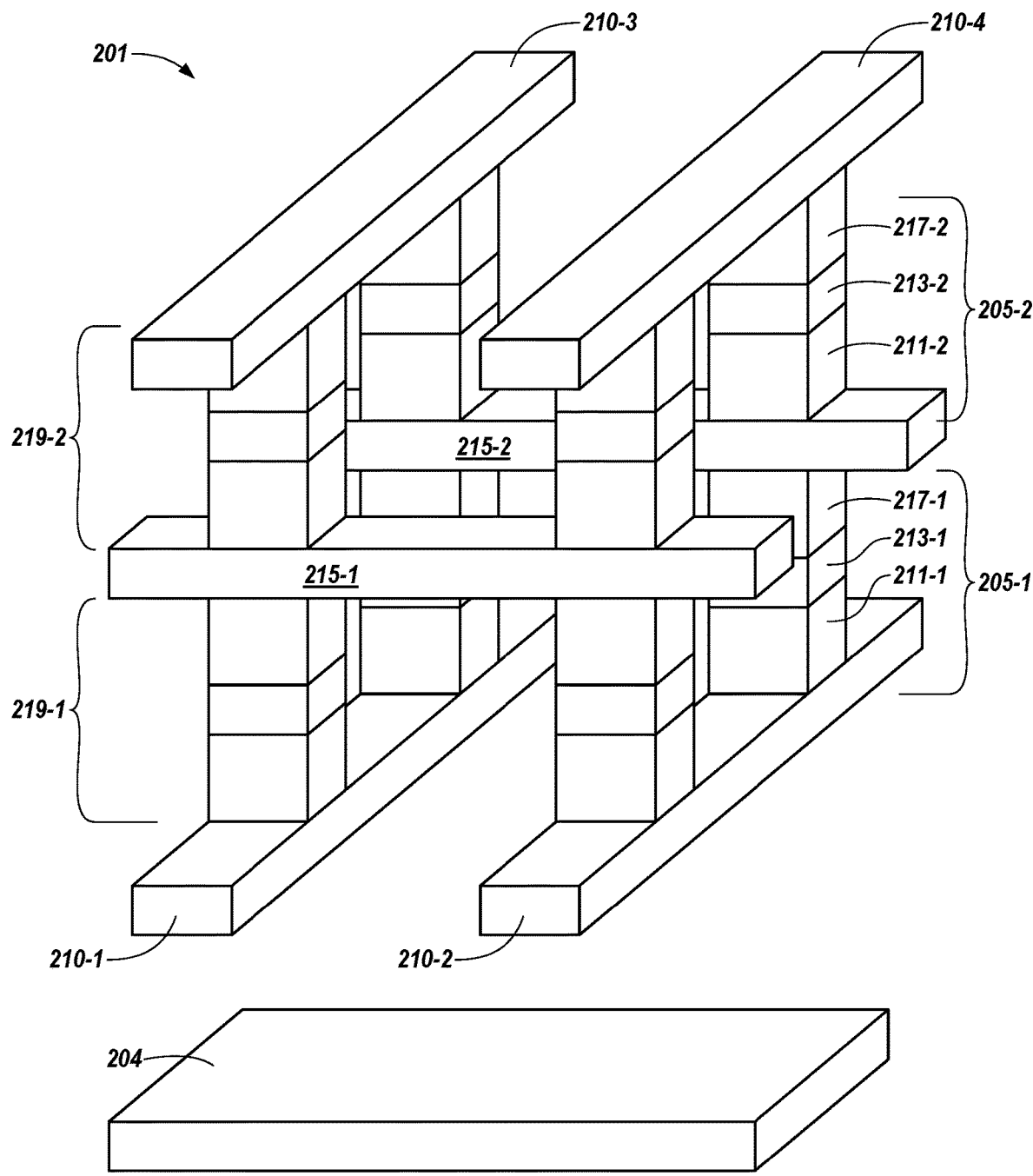
FIG. 2 illustrates an example of a portion of a three-dimensional memory array that supports weight storage using a memory device in accordance with embodiments of the present disclosure.

FIG. 2 illustrates an example of a portion of a 3D memory array 201 that supports weight storage using a memory device in accordance with various embodiments of the present disclosure. Memory array 201 may be an example of portions of memory array 130 described with reference to FIG. 1. Memory array 201 may include a first array or deck 219-1 of memory cells that is positioned above a substrate 204 and a second array or deck 219-2 of memory cells on top of the first array or deck 219-1. Memory array 201 may also include access line 210-1, access line 210-2, sense line 215-1, and sense line 215-2, which may be examples of access lines and sense lines, as described with reference to FIG. 1. As in the illustrative example depicted in FIG. 2, memory cells of the first deck 219-1 and the second deck 219-2 may each include a self-selecting memory cell, such as memory cell 205-1 and 205-2, respectively. In some examples, memory cells 205-1, 205-2 of the first deck 219-1 and the second deck 219-2 may each include another type of memory cell that may be suitable for a cross-point architecture—e.g., a CBRAM cell or an FeRAM cell. Although some elements included in FIG. 2 are labeled with a numeric indicator, other corresponding elements are not labeled, though they are the same or would be understood to be similar, in an effort to increase the visibility and clarity of the depicted features.

In some cases, self-selecting memory cells 205-1 of the first deck 219-1 may each include first electrode 211-1, variable resistance (e.g., chalcogenide) material 213-1, and second electrode 217-1. In addition, self-selecting memory cells of the second deck 219-2 may each include first electrode 211-2, variable resistance (e.g., chalcogenide) material 213-2, and second electrode 217-2. In some embodiments, access lines (e.g., access line 210 in FIG. 1) may include an electrode layer (e.g., a conformal layer), in lieu of electrodes 211 or 217 and thus may comprise multi-layered access lines. In such embodiments, the electrode layer of the access lines may interface with a memory material (e.g., chalcogenide material 213). In some embodiments, access lines (e.g., access line 210, sense line 215) may directly interface with a memory material (e.g., chalcogenide material 213) without an electrode layer or an electrode in-between.

The self-selecting memory cells of the first deck 219-1 and second deck 219-2 may, in some embodiments, have common conductive lines such that corresponding (e.g., vertically aligned in y-direction) self-selecting memory cells of each deck 219-1 and 219-2 may share sense lines (215) or access lines (210) as described with reference to FIG. 1. For example, first electrode 211-2 of the second deck 219-2 and second electrode 217-1 of the first deck 219-1 may both be coupled to sense line 215-2 such that sense line 215-2 is shared by vertically aligned and adjacent self-selecting memory cells (in y-direction).

The architecture of memory array 201 may in some cases be referred to as an example of a cross-point architecture, as a memory cell may be formed at a topological cross-point between an access line 210 and a sense line 215, as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures.

While the example of FIG. 2 shows two memory decks, other configurations may include any number of decks. In some embodiments, one or more of the memory decks may include self-selecting memory cells that include variable resistance (e.g., chalcogenide) material 213. In other embodiments, one or more of the memory decks may include FeRAM cells that include a ferroelectric material. In yet other embodiments, one or more of the memory decks may include CBRAM cells that include a metallic oxide or a chalcogenide material. Chalcogenide materials 213 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy.

A memory cell 205 may, in some embodiments, include a self-selecting memory (SSM) cell. It is to be understood that the memory cell 205 may also include a memory cell of another type—e.g., a 3D cross-point memory cell, a phase-change memory (PCM) cell that includes a storage component and a selection component, a CBRAM cell, or a FeRAM cell.

In some examples, as will be described below, neural network operations can be performed on the cells 205 such that a conductivity of the cells 205 is increased in response to operation of short-term and/or long-term memory operations being performed on the cells 205. As an example, performing a plurality of short-term memory operations on a particular memory cell 205 can increase a conductivity of the particular memory cell 205 and thereby represent an increase in short-term memory learning. The increased conductivity of the particular cell 205 causes the cell to conduct at a lower threshold voltage than prior to the short-term memory learning. In this way, the analog increase in conductivity can be used to represent short-term memory learning.

Additionally, a second particular memory cell 205 can be degraded prior to performing neural network operations on the second particular memory cell 205, thereby representing long-term memory learning. As an example, the degradation of the second particular memory cell 205 can irreversibly increase the conductivity of the second particular memory cell 205 in a given state (e.g., SET or RESET) prior to performing other (e.g., long-term) memory operations. In this way, a previously built-in conductive increase more closely mimics long-term memory learning than a memory cell that has not been previously degraded (e.g., cells used for short-term memory learning). Additional detail on short and long-term memory operations is described further herein.

The memory array 201 may include two or more two-dimensional (2D) memory arrays formed on top of one another. This may increase a number of memory cells that may be placed or created on a single die or substrate as compared with a single 2D array, which in turn may reduce production costs, or increase the performance of the memory device, or both. In the example depicted in FIG. 2, memory array 201 includes two levels of memory cells 205 (e.g., memory cell 205-1 and memory cell 205-2) and may thus be considered a 3D memory array; however, the number of levels may not be limited to two, and other examples may include additional levels. Each level may be aligned or positioned such that memory cells 205 may be aligned (exactly, overlapping, or approximately) across levels with each other.

By way of example, two components physically connected via a switch (e.g., a transistor) are in electronic communication or may be coupled regardless of the state of the switch (i.e., open or closed). A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

As shown in FIG. 2, the two memory cells 205-1, 205-2 that are stacked may share a common conductive line such as a sense line 215-2. That is, a sense line 215-2 may be coupled with the upper memory cell 205-2 and the lower memory cell 205-1. Other configurations may be possible, for example, a third layer (not shown) may share an access line with the upper memory cell 205-2.

In some cases, an electrode may couple a memory cell 205 to an access line 210 or a sense line 215. The term "electrode" refers to an electrical conductor, and may include a trace, wire, conductive line, conductive layer, or the like that provides a conductive path between elements or components of memory array 201. Thus, the term electrode may refer in some cases to a signal line, such as an access line 210 or a sense line 215, as well as in some cases to an additional conductive element employed as an electrical contact between an access line and a memory cell 205. In some embodiments, a memory cell 205 may comprise a chalcogenide material positioned between a first electrode and a second electrode. The first electrode may couple the chalcogenide material to an access line 210, and the second electrode may couple the chalcogenide material to a sense line 215. The first electrode and the second electrode may be the same material (e.g., carbon) or different material. In one embodiment, a memory cell 205 may be coupled directly with one or more access lines, and electrodes other than the access lines may be omitted.

Operations such as reading and writing, short-term memory operations, and/or long-term memory operations may be performed on memory cells 205 by activating or selecting one of access lines 210 and one of sense lines 215. Activating or selecting an access line 210 or a sense line 215 may include applying a voltage to the respective signal line. Activation of the access line 210 or the sense line 215 may bring voltage to a memory cell 205 and thereby increase a conductance, and thereby increase a synaptic weight, associated with a particular memory cell 205. The increased synaptic weight can be indicative of an increase in learning (e.g., in short-term or long-term learning, as will be described below). Access lines 210 and sense lines 215 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the storage component of a cell (e.g., a resistive component in a CBRAM cell, a capacitive component in a FeRAM cell) may be electrically isolated from the signal line by a selection component. The term "isolated" refers to a relationship between components in which electrons are not presently capable of flowing between them; components are isolated from each other if there is an open circuit between them. For example, two components physically connected by a switch may be isolated from each other when the switch is open. In other examples, as described herein, the selection component may be a variable resistance component of a variable resistance memory cell, which may comprise chalcogenide matial. A variable resistance memory cell may refer to a self-selecting memory cell, as described below. Specifically, the variable resistance memory cell can be a self-selecting memory cell, comprising a single material (e.g., the chalcogenide material) which can serve as both a selection component and a storage component for the memory cell.

The access line 210 may be connected to and may control the selection component. For example, the selection component may be a transistor and the access line 210 may be connected to the gate of the transistor. Alternatively, the selection component may be a variable resistance component, which may comprise chalcogenide material. Activating the access line 210 may result in an electrical connection or closed circuit between the storage component of the memory cell 205 and its corresponding sense line 215. The sense line may then be accessed to either read or write data stored in the memory cell 205. Upon selecting a memory cell 205, the resulting signal may be used to determine the stored logic state. In some cases, a first logic state may correspond to no current or a negligibly small current through the memory cell 205, whereas a second logic state may correspond to a finite current or a threshold current. As described herein, a continuum of increasing conductivity may correspond to an increase in short-term memory or long-term memory learning. As an example, neural network operations can be performed on short-term memory cells, which cause a conductivity of the short-term memory cells to increase, representing an increase in short-term memory learning. Likewise, neural network operations can be performed on long-term memory cells (e.g., cells that have been previously degraded), which cause a conductivity of the long-term memory cells to increase, representing an increase in long-term memory learning. The neural network operations can be performed in response to a neural network algorithm indicating that short-term memory learning or long-term memory learning has occurred.

Upon accessing, a memory cell 205 may be read, or sensed, by a sense component (not illustrated) to determine the stored state of the memory cell 205. For some memory cells, such as resistance variable memory cells, the stored state can be synonymous with the threshold voltage of the memory cell. For example, a voltage may be applied to a memory cell 205 (using the corresponding access line 210 and sense line 215) and the presence of a resulting current through the memory cell 205 may depend on the applied voltage and the threshold voltage of the memory cell 205. In some cases, more than one voltage may be applied. Additionally, if an applied voltage does not result in current flow, other voltages may be applied until a current is detected by a sense component. By assessing the voltage that resulted in current flow, the stored logic state of the memory cell 205 may be determined. In some cases, the voltage may be ramped up in magnitude until a current flow is detected. In other cases, predetermined voltages may be applied sequentially until a current is detected. Likewise, a current may be applied to a memory cell 205 and the magnitude of the voltage to create the current may depend on the electrical resistance or the threshold voltage of the memory cell 205. An increase in the threshold voltage at which a current flows through a cell (e.g., conducts) can indicate an increase in neural network learning (e.g., short-term memory learning or long-term memory learning, depending on which type of cell's threshold voltage is increased).

In some cases, the memory cell 205 (e.g., a phase change memory cell or a self-selecting memory cell) may comprise a chalcogenide material. The chalcogenide material of the memory cell may remain in an amorphous state during the access operation. In some cases, operating the memory cell may include applying various shapes of programming pulses to the memory cell to program a particular threshold voltage of the memory cell—that is, a threshold voltage of a memory cell may be modified by changing a shape of a programming pulse, which may alter a phase or a state of the chalcogenide material in the memory cell. In short-term memory cells, this altered phase or state of the chalcogenide material may be reversed by resetting (e.g., performing a RESET) the short-term memory cell. However, in long-term memory cells, the initial degradation (caused by performance of forced write cycle operations) is not reversed by resetting the long-term memory cell. Resetting the long-term memory cell will not reset its threshold voltage (or conductivity) to be the same as the threshold voltage of a short-term memory cell that has been reset.

The threshold voltage may be associated with the chalcogenide material in that it represents a degree of conductivity of the chalcogenide material depending on, for example, how amorphous it is, in the case of SSM memory, or how amorphous or crystalline it is, in the case of 3D crosspoint memory. The threshold voltage can indicate a particular degree or amount of learning that has occurred in relation to the memory cell.

Sense components may include various transistors or amplifiers in order to detect and amplify signals associated with a sensed memory cell 205, which may be referred to as latching. The detected response of the memory cell 205 in response to the voltage at which the cell 205 conducts may then be output through a column decoder as output. In some cases, the sense component may be part of a column decoder or row decoder. Or, in another embodiment, the sense component may be connected to or in electronic communication with a column decoder or a row decoder. In at least one embodiment, an alternative option, or an option in addition to the one illustrated in FIG. 2, can include arranging a sense component such that it is coupled to the plurality of access lines 210. As an example, an ordinary person skilled in the art would appreciate that the sense component may be associated either with column decoder (as illustrated) or row decoder (whose association with the sense component is not illustrated) without losing its functional purposes.

The memory array 201 may be configured to mimic neuro-biological architectures based on the amount of learning by having threshold voltages of the memory cells 205 modified in an "analog" fashion corresponding to the amount of learning. The memory array 201 may leverage properties of chalcogenide memory and corresponding effects of degradation mechanisms to provide an output, which may be referred to as an analog output, corresponding to the amount of learning. As will be described further below in association with FIGS. 6A-8B, the degradation mechanism can be based on a number of cycles performed on a memory cell. As an example, a memory cell that has been cycled 0-100 times can be less affected by the degradation mechanism and can be referred to as a short-term memory learning cell. As an example, a memory cell that has experienced 10,000 or more forced write cycles can be more affected by the degradation mechanism and can be referred to as a long-term memory learning cell.

In some memory devices, applying an electronic pulse to a chalcogenide material 213-1, 213-2 (hereinafter referred collectively as 213) may cause the chalcogenide material 213 to be affected, which may in some cases include changing physical form. The physical forms for some chalcogenide materials 213 include an amorphous state and a crystalline state. The resistance of these physical forms is different, thereby allowing the chalcogenide material 213 to have a variety of threshold voltages associated with the chalcogenide material 213. In some chalcogenide memory systems, to cause the chalcogenide material 213 to be in an amorphous state, a controller may heat the chalcogenide material 213 with an electrical pulse and rapidly cool the chalcogenide material 213 by removing the pulse. The rapid cooling may cause the structure of the chalcogenide material 213 to be less ordered and therefore more resistive.

In some 3D crosspoint and/or PCM systems, to cause the chalcogenide material 213 to be in a crystalline state, a controller may heat the chalcogenide material 213 with an electrical pulse and slowly cool the chalcogenide material 213 by ramping down the electrical pulse. The slow cooling may provide time for the structure of the chalcogenide material 213 to become more ordered and therefore less resistive. Memory cells of the memory array 201 may use these properties of chalcogenide materials to be associated with analog values associated with threshold voltages that correspond to an amount of learning A first portion of a memory array 201 can be used to perform short-term memory operations and a second portion of the memory array 201 can be used to perform long-term memory operations. A plurality of short-term memory operations can be performed on the first portion (e.g., such as first portion 122 in FIG. 1) of the memory array 201 and a plurality of long-term memory operations can be performed on the second portion (e.g., such as second portion 124 in FIG. 1) in order to perform a plurality of neural network operations. The short-term memory operations can increase a synaptic weight associated with a cell of the memory array in a reversible manner such that the short-term memory cells can be reset to a baseline conductance (e.g., synaptic weight). Long-term memory cells, such as in the second portion, can experience a plurality of forced write cycles that increase conductance of the long-term memory cells prior to performing the long-term memory operations. The degradation of the long-term memory cells caused by the forced write cycles can irreversibly increase the conductance. As long-term memory operations are performed on these long-term memory cells, an increased conductance due to the long-term memory operations can be reversed, but not back to the baseline conductance. Put another way, a conductance from resetting the long-term memory cells prior to the forced write cycling operations would be less than a conductance from resetting the long-term memory cells subsequent to the forced write cycling operations.

Figure 3:
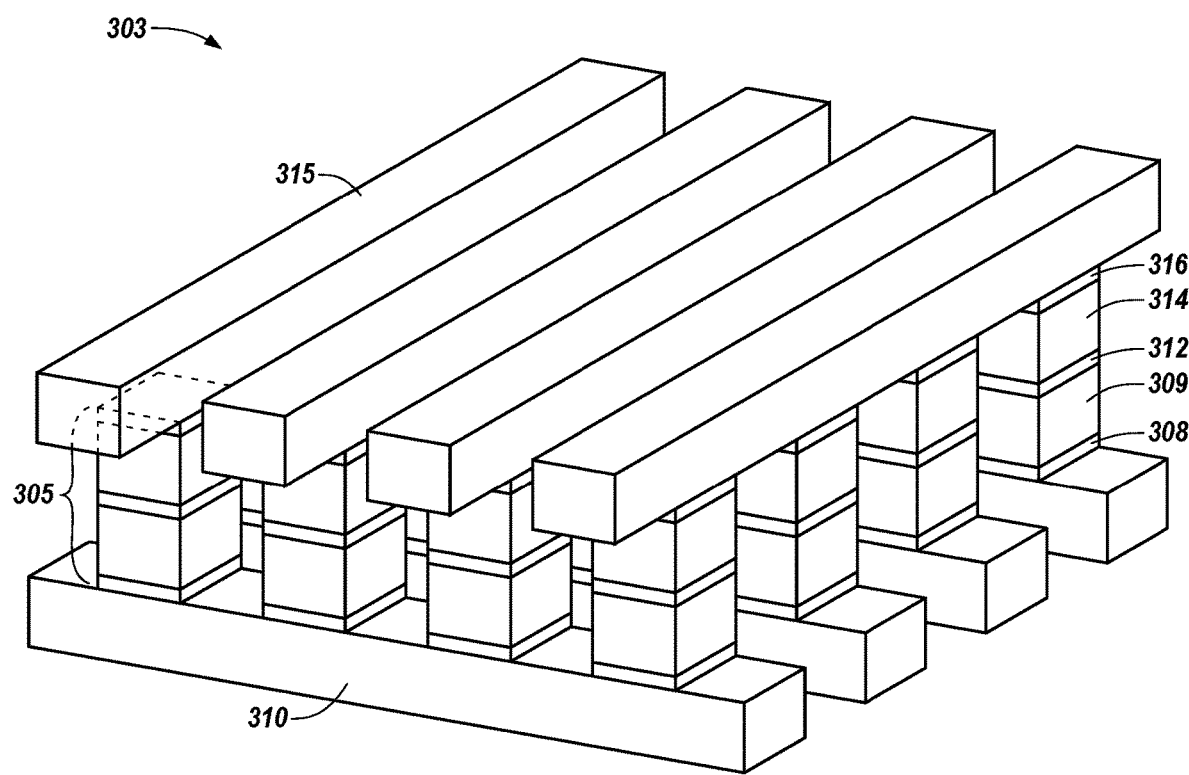
FIG. 3 illustrates a perspective view of a portion of a memory array in accordance with a number of embodiments of the present disclosure.

FIG. 3 illustrates a perspective view of a portion of a memory array 303 in accordance with a number of embodiments of the present disclosure. The memory array 303 can have a cross point architecture having memory cells 305 located at the intersections of a number of access lines 310 and a number of sense lines 315, e.g., data/sense lines, which may be referred to herein as bit lines. As illustrated, the access lines 310 are substantially parallel to each other and are substantially orthogonal to the sense lines 315, which are substantially parallel to each other. However, embodiments are not limited to a parallel/orthogonal configuration.

In various embodiments, the memory cells 305 can have a "stack" structure. Each memory cell 305 can include a storage component connected in series with a respective select component formed between access lines 310 and sense lines 315. The storage component can be a variable resistance storage component. The variable resistance storage component may include a variable resistance storage component material 309 formed between a pair of electrodes, e.g., 308 and 312. The select component can include a select material 314 formed between a pair of electrodes, e.g., 312 and 316.

The memory cells 305 of memory array 303 can comprise the select component in series with a phase change material, such that the memory array 303 can be referred to as a phase change material and switch (PCMS) array. In a number of embodiments, the select component can be a two-terminal ovonic threshold switch (OTS), for instance. An OTS can include, for example, a chalcogenide material formed between a pair of conductive materials, e.g., conductive electrodes. Responsive to an applied voltage across the OTS that is less than a threshold voltage, the OTS can remain in an "off" state, e.g., an electrically nonconductive state. Alternatively, responsive to an applied voltage across the OTS that is greater than the threshold voltage, the OTS can snapback to an "on" state. In the "on" state, the OTS device can carry substantial current with a voltage at its terminals remaining almost constant to the so-called "holding voltage" level.

Embodiments of the present disclosure are not limited to PCMS cross-point arrays or a particular cell select switch. For instance, the methods and apparatuses of the present disclosure can be applied to other cross-point arrays such as arrays utilizing resistive random access memory (RRAM) cells, conductive bridging random access memory (CBRAM) cells, and/or spin transfer torque random access memory (STT-RAM) cells, among other types of memory cells, for example.

In embodiments in which the variable resistance storage component comprises a PCM, the phase change material can be a chalcogenide alloy such as an indium (In)-antimony (Sb)-tellurium (Te) (IST) material, e.g., $In_2Sb_2Te_5$, $In_1Sb_2Te_4$, $In_1Sb_4Te_7$, etc., or a germanium (Ge)-antimony (Sb)-tellurium (Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of variable resistance materials include transition metal oxide materials or alloys including two or more metals, e.g., transition metals, alkaline earth metals, and/or rare earth metals. Embodiments are not limited to a particular variable resistive material or materials associated with the storage components of the memory cells 305. For instance, other examples of variable resistive materials that can be used to form storage components include binary metal oxide materials, colossal magnetoresistive materials, and/or various polymer based variable resistance materials, among others.

In a number of embodiments, an electrode can be shared between the select component and storage component of the memory cells 305. Also, in a number of embodiments, the access lines 310 and the sense lines 315 can serve as top or bottom electrodes corresponding to the memory cells 305.

In a number of embodiments, the variable resistance storage component material 309 can comprise one or more of the same material(s) as the select material 314. However, embodiments are not so limited. For example, the variable resistance storage component material 309 and the select material 314 can comprise different materials. According to various embodiments of the present disclosure, relative positioning of the resistive storage component material 309 and the cell select material 314 can be reversed from that shown in FIG. 3.

The materials described herein may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

Although not illustrated in FIG. 3, in a number of embodiments, the memory array 303 can be part of a 3D architecture, with a number of planes, e.g., tiles, decks, vertically stacked on each other. In such embodiments, access lines 310 and sense lines 315 can be communicatively coupled to the memory cell of one plane of the 3D array, for instance. Additionally, the memory array 303 can be connected, e.g., via access lines 310 and sense lines 315 to circuitry associated with the memory array, e.g., decode circuitry among various other circuitry associated with operating memory array 303. Elements, e.g., transistors, etc., of such circuitry associated with the memory array 303 can be formed to underlie memory array 100, for instance.

In operation, the memory cells 305 of memory array 303 can be programmed by applying a voltage, e.g., a write voltage, across the memory cells 305 via selected access lines 310, and sense lines 315. The width and/or magnitude of the voltage pulses across the memory cells 305 can be adjusted, e.g., varied, in order to program the memory cells 305 to particular data states, e.g., by adjusting the resistance level (e.g., threshold voltage) of the storage component. The adjustment of the threshold voltage of a memory cell can correspond to a particular amount of learning (e.g., neural network learning) associated with the adjusted memory cell. The adjustment of the threshold voltage of a memory cell can be achieved by performing a plurality of READ pulsing (e.g., RESET read disturb pulses when using a self-selecting memory cell) or short SET pulsing (when using a 3D cross-point memory cell, such as a 3D Xpoint™ memory cell). As an example, the short SET pulses can be short sub-threshold voltage SET pulses that increase a conductance of a cell.

A sensing, e.g., read, operation can be used to determine the threshold voltage, and thereby an amount of a synaptic weight associated with learning, of a memory cell 305. For instance, particular voltages can be applied to a sense line 315 and access line 310 corresponding to a selected memory cell 305, and current through the cell responsive to a resulting voltage difference can be sensed, indicating a threshold voltage of a memory cell 305. Sensing operations can also include biasing unselected access lines 310 and sense lines 315, e.g., word lines and bit lines connected to non-selected cells, at particular voltages in order to sense the data state of a selected cell 305.

Figure 4A:
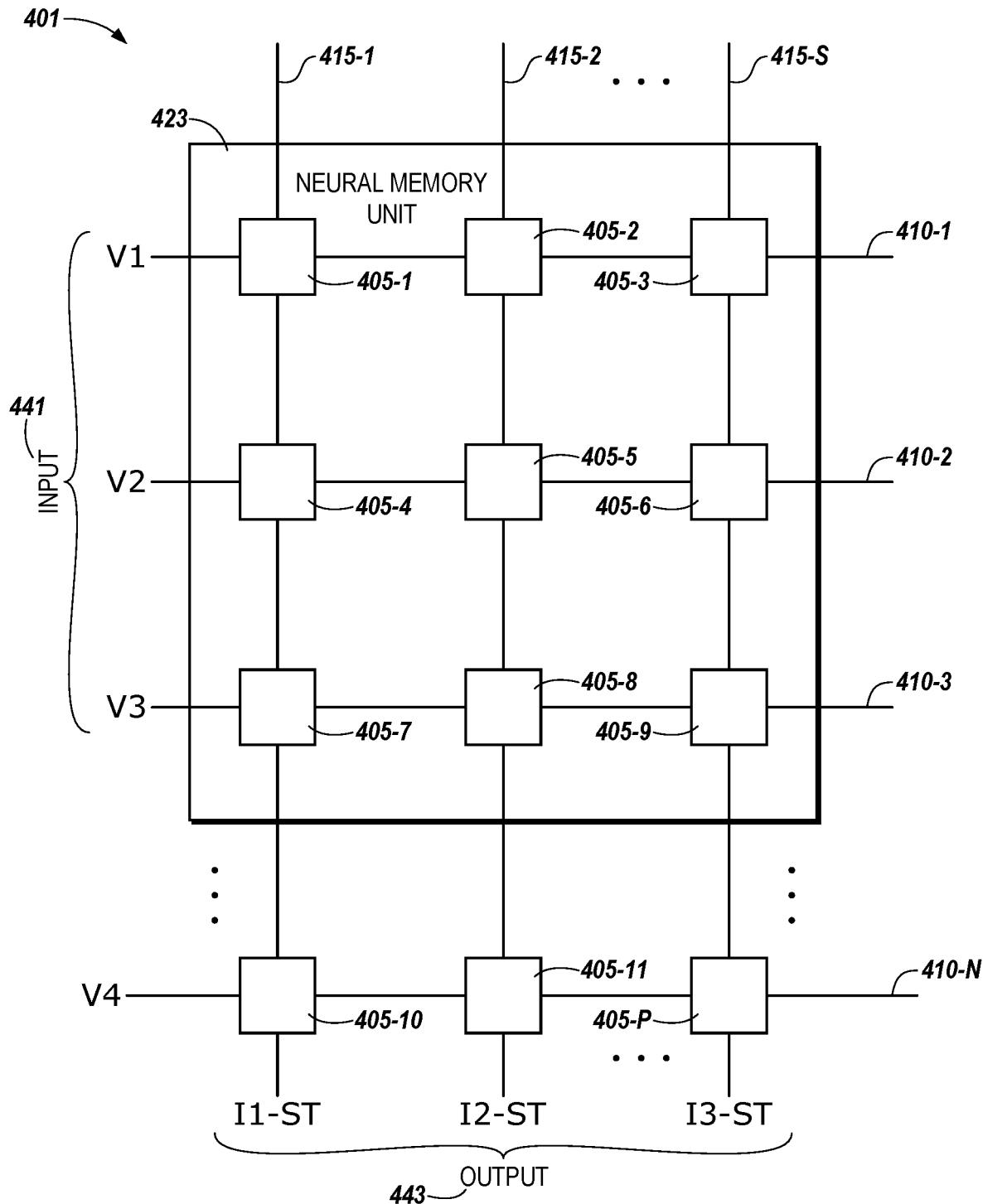
FIG. 4A illustrates an example of a memory array that shows features of an operation on a plurality of memory cells that support weight storage for short-term memory learning using a memory device in accordance with embodiments of the present disclosure.

FIG. 4A illustrates an example of a memory array 401 that supports weight storage using a memory device in accordance with various embodiments of the present disclosure. The memory array 401 may be an example of a portion of the memory device 100 and memory array 201 or 303 described with reference to FIGS. 1-3, respectively. The memory array 401 may include a plurality of memory cells 405 associated with an analog conductance, corresponding to a synaptic weight and thereby an amount of learning associated with the cell. In this way, the plurality of memory cells 405 may be configured to mimic neuro-biological architectures that may be present in a nervous system and/or to store one or more synaptic weights. As such, the plurality of memory cells 405 may be an example of a neuromorphic system and/or a portion of a neural network.

Some neuromorphic systems may use resistive RAM (RRAM) such as PCM devices or self-selecting memory devices to store a value (or weight) of a synapse. Such resistive memory may include memory cells configured to store multiple levels and/or that may have wide sense windows. Such types of memory may be configured to perform training operations by pulse (e.g., spike) control. Such training operations may include spike-timing-dependent plasticity (STDP). STDP may be form of Hebbian learning that is induced by correlation between spikes transmitted between nodes (e.g., neurons). STDP may be an example of a process that adjusts the strength of connections between nodes (e.g., neurons).

FIG. 4A illustrates an example of a memory array 401 that shows features of a read operation of a plurality of memory cells 405 that support weight storage for short-term memory learning using a memory device in accordance with embodiments of the present disclosure. The memory array 401 may be an example of the memory array 303 described with reference to FIG. 3. The memory array 401 may include a plurality of memory cells 405-1, 405-2, 405-3, 405-4, 405-5, 405-6, 405-7, 405-8, 405-9. The plurality of memory cells 405 may be coupled to a plurality of sense lines 415-1, 415-2, . . . , 415-S (hereinafter referred to collectively as plurality of sense lines 415) and a plurality of access lines 410-1, 410-2, 410-3, . . . , 410-N (hereinafter referred to collectively as plurality of access lines 410).

A read operation on the plurality of memory cells 405 may be configured to detect a threshold voltage at which each of the plurality of memory cells 405 conducts (e.g., synaptic weights) and combining those threshold voltages (e.g., combining the synaptic weights) for a combined output 443.

A controller (e.g., memory controller 140) may select a particular memory cell 405 or a group of memory cells 405 for a read operation. In some cases, the controller may select one or more memory cells 405 for a read operation. The controller may also identify or select one or more sense lines 415 and/or access lines 410 associated with at least one of the plurality of memory cells 405.

The controller may provide an input 441 to the plurality of memory cells 405. The input 441 may comprise a plurality of voltage values applied to a plurality of access lines 410 (e.g., V1, V2, V3). The controller may bias the access lines 410 to one or more voltage values (e.g., a read voltage value) included in the input 441. In some cases, the access lines 410 are all biased to the same read voltage. In some cases, the controller may bias one or more access lines to a different voltage than the other access lines.

The controller may also bias one or more unselected access lines 410-N (e.g., one or more access lines not coupled with some of the plurality of memory cells 405) to a read voltage value. In some cases, the read voltage values applied to the one or more unselected access lines 410-N are the same as the voltage values applied to the selected access lines 410-1, 410-2, 410-3. In some cases, the read voltage values applied to the one or more unselected access lines 410-N are different than at least one voltage value applied to at least one of the selected access lines 410-1, 410-2, 410-3.

The controller may detect an output 443 that includes one or more signals generated on one or more sense lines 415 coupled to at least one of the plurality of memory cells 405. The output 443 on the sense lines 415 may be generated based on applying the input 441 to the access lines 410 coupled with at least one of the plurality of memory cells 405. As an example, the input 441 can be a particular voltage applied to a cell 405 and, in response to the particular voltage being at least the threshold voltage of the cell 405, the cell 405 can generate an output signal that is sent along sense lines 415 and as one of the current signals. For example, the signals of the output 443 may comprise current signals (e.g., I1-ST, I2-ST, I3-ST) corresponding to a particular sense line 415. The current signals I1-ST, I2-ST, and I3-ST can be current signals that result from short-term memory learning. As the threshold voltage of a cell is decreased, the conductance of the cell is increased and the input 441 is more likely to cause the cell to conduct, indicating the short-term memory learning.

Figure 5:
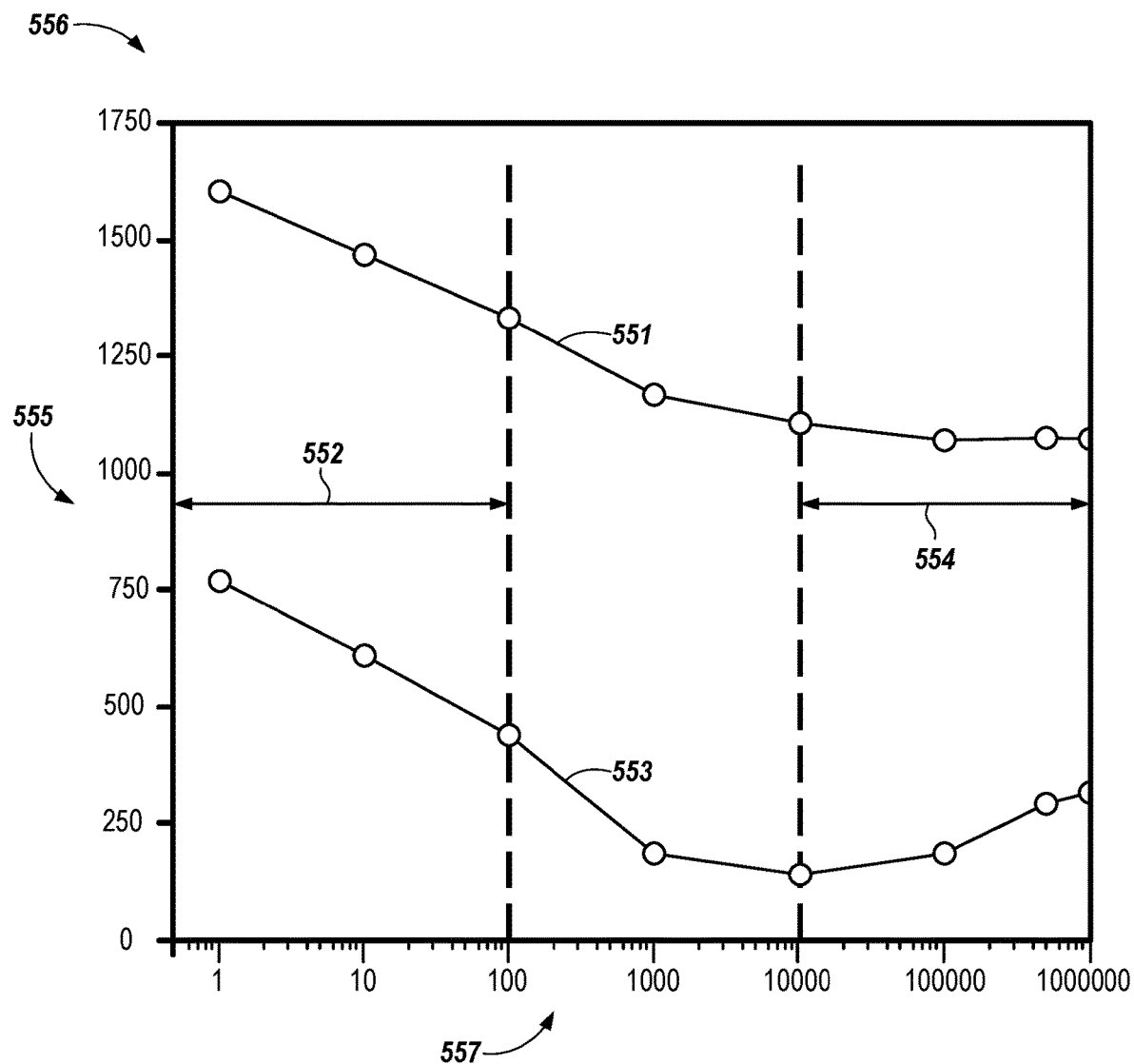
FIG. 5 illustrates an example of a graph of the threshold voltage for a memory cell of a three-dimensional (3D) cross-point memory array in accordance with embodiments of the present disclosure.
Figure 6A:
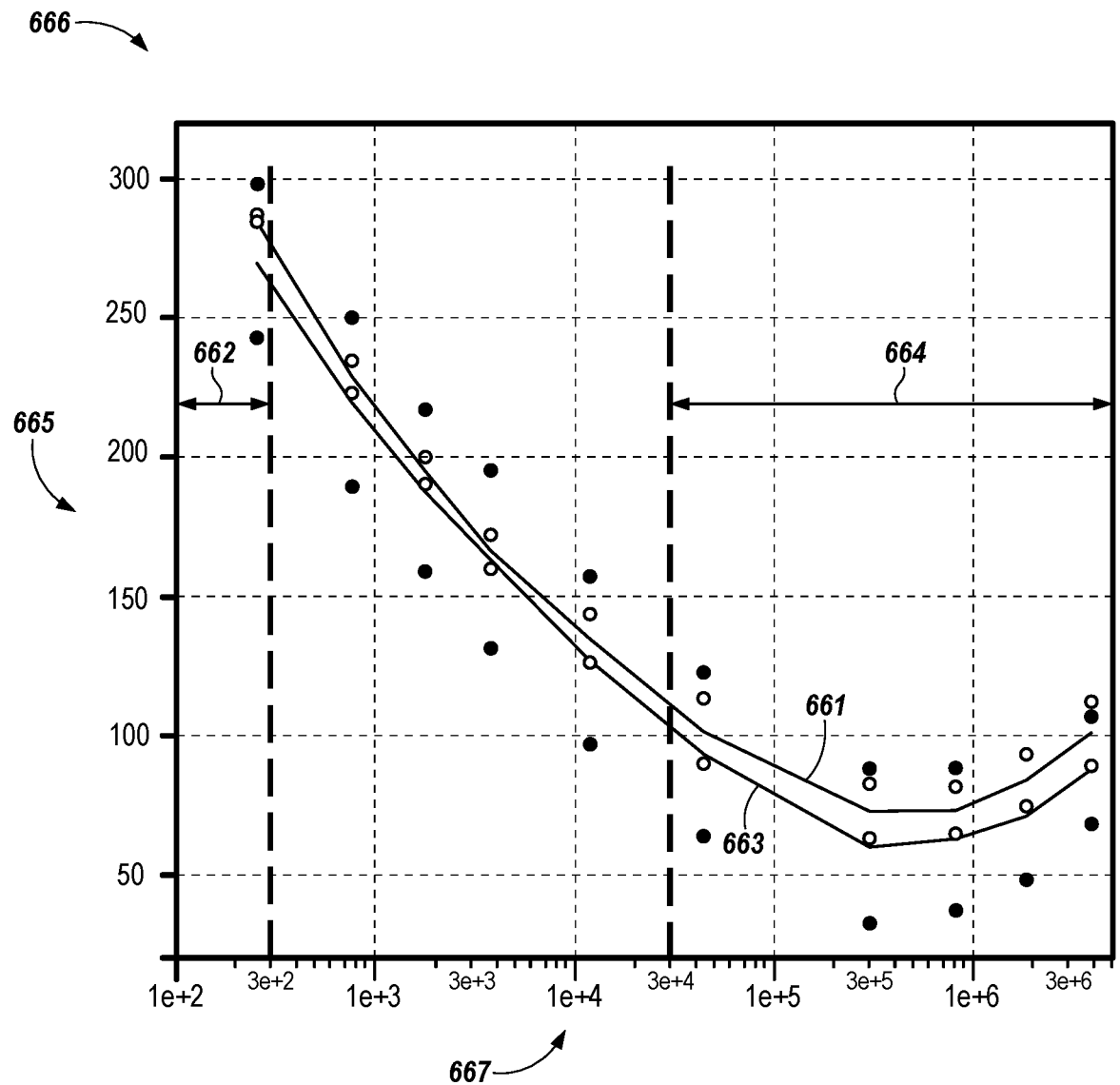
FIG. 6A illustrates an example of a graph showing the threshold voltage for a self-selecting (SSM) memory cell in a SET state in accordance with embodiments of the present disclosure.
Figure 6B:
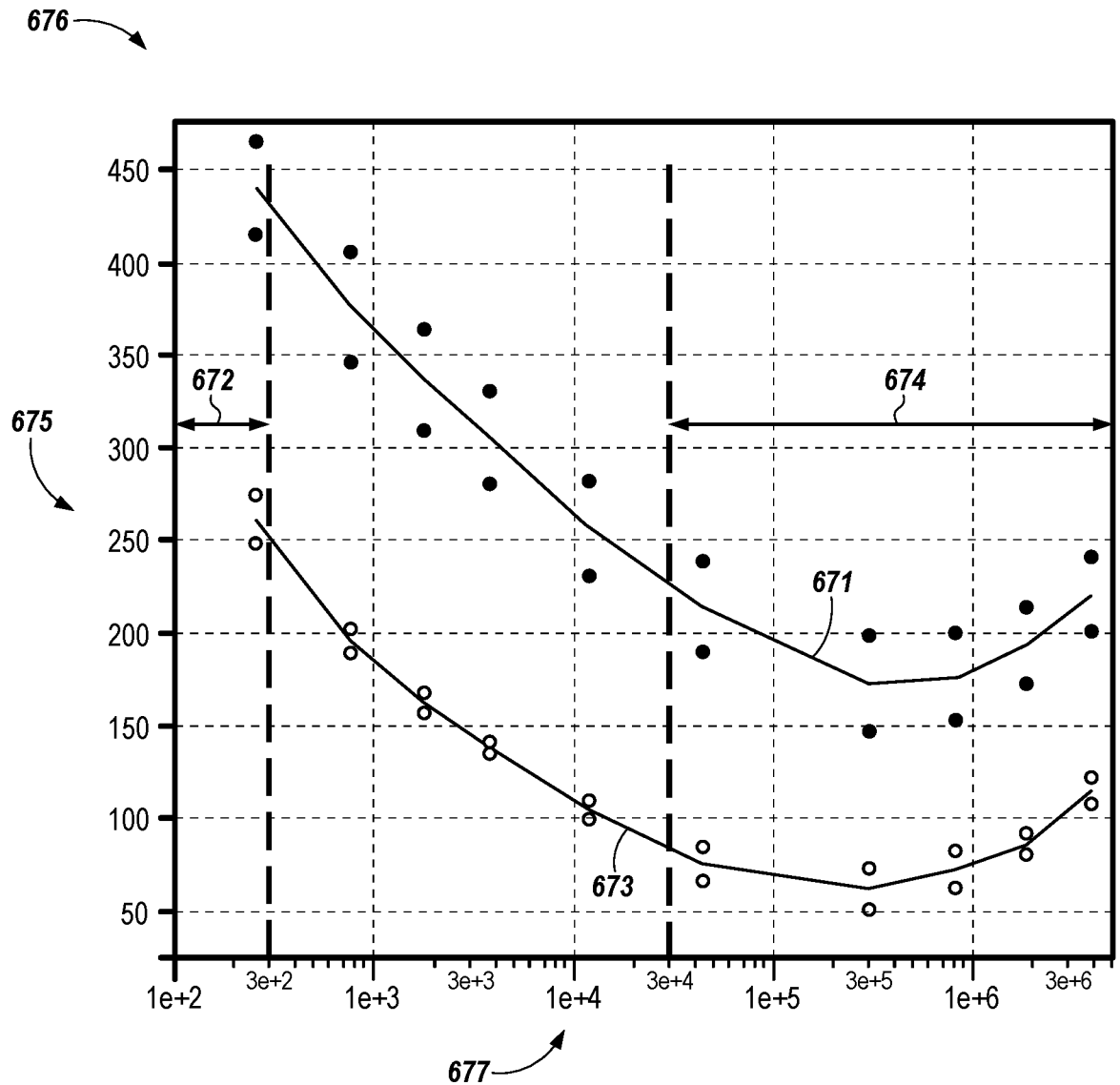
FIG. 6B illustrates an example of a graph showing the threshold voltage for a self-selecting (SSM) memory cell in a RESET state in accordance with embodiments of the present disclosure.

As an example, neural network operations (e.g., short-term memory operations or long-term memory operations) can include a number of short SET pulses performed on memory cells of a 3D cross-point array, as is illustrated in FIG. 5. A short SET pulse can be a short programming pulse, shorter than a SET pulse, intended to change the voltage of the cell to be somewhere between a RESET state and a SET state. The short SET pulses can be performed on memory cells in a preconditioned RESET state. Further, as an example, neural network operations (e.g., short-term memory operations or long-term memory operations) can include a number of RESET read disturb pulses performed on self-selecting memory (SSM) cells of an SSM array, as is illustrated in FIGS. 6A-6B. A RESET read disturb pulse refers to a read pulse which can disturb the state of a cell. As an example, the effect of applying multiple such RESET read disturb pulses can be to disturb the state of the cell, tending to move the voltage of the RESET state of the cell toward a SET state of the cell. The RESET read disturb pulses can be performed on SSM cells that are in a preconditioned RESET state. The short-term memory operations can be performed on memory cells (short-term memory cells) that have been placed in a RESET state and are at a baseline conductance. In contrast, the long-term memory operations can be performed on memory cells that have experienced a number of forced write cycles whereby the conductance of the long-term memory cells have been permanently increased. The long-term memory cells' conductance, even after being reset, is greater than a conductance of the memory cells prior to experiencing the forced write cycles (which permanently degrades the long-term memory cells). To clarify, the long-term memory operations can increase an initial conductance of the long-term memory cells that have been degraded and this increased conductance may be returned to the initial conductance after a reset but the increased conductance due to degradation may not be reversed.

An individual signal, which represents an individual weight, may be detected on each sense line 415 coupled with the plurality of memory cells 405. Each signal may have different memory cells contributing to the signal. For example, the first memory cell 405-1 may contribute to the signal on the first sense line 415-1. The second memory cell 415-2 may contribute to the signal on the second sense line 415-2. The third memory cell 405-3 may contribute to the signal on the third sense line 415-3. The fourth memory cell 405-4 may also contribute to the signal on the first sense line 415-1, the fifth memory cell 405-4 may also contribute to the signal on the second sense line 415-2, and so forth.

The controller may determine the threshold voltages associated with the plurality of memory cells based on detecting whether each of the plurality of memory cells conducts at a particular voltage applied to the plurality of memory cells 405. The controller may combine signals on each sense line 415 to generate a total signal representing a total weight. The analog value, corresponding to which or how many cells conduct, may be proportional to and/or based on the total weight. The controller may sum the signals of the sense lines 415 to generate the total weight. In some cases, the controller may generate a product by applying a weight matrix to an input vector of voltages that represent the one or more voltages on one or more access lines (e.g., the vector V1, V2, V3). Generating the product may result in an output 443 that represents the threshold voltages of the plurality of memory cells 405. In some cases, a current on a sense line during the read operation may be a combination of multiple analog weights stored in multiple cells on the same sense line.

Figure 4B:
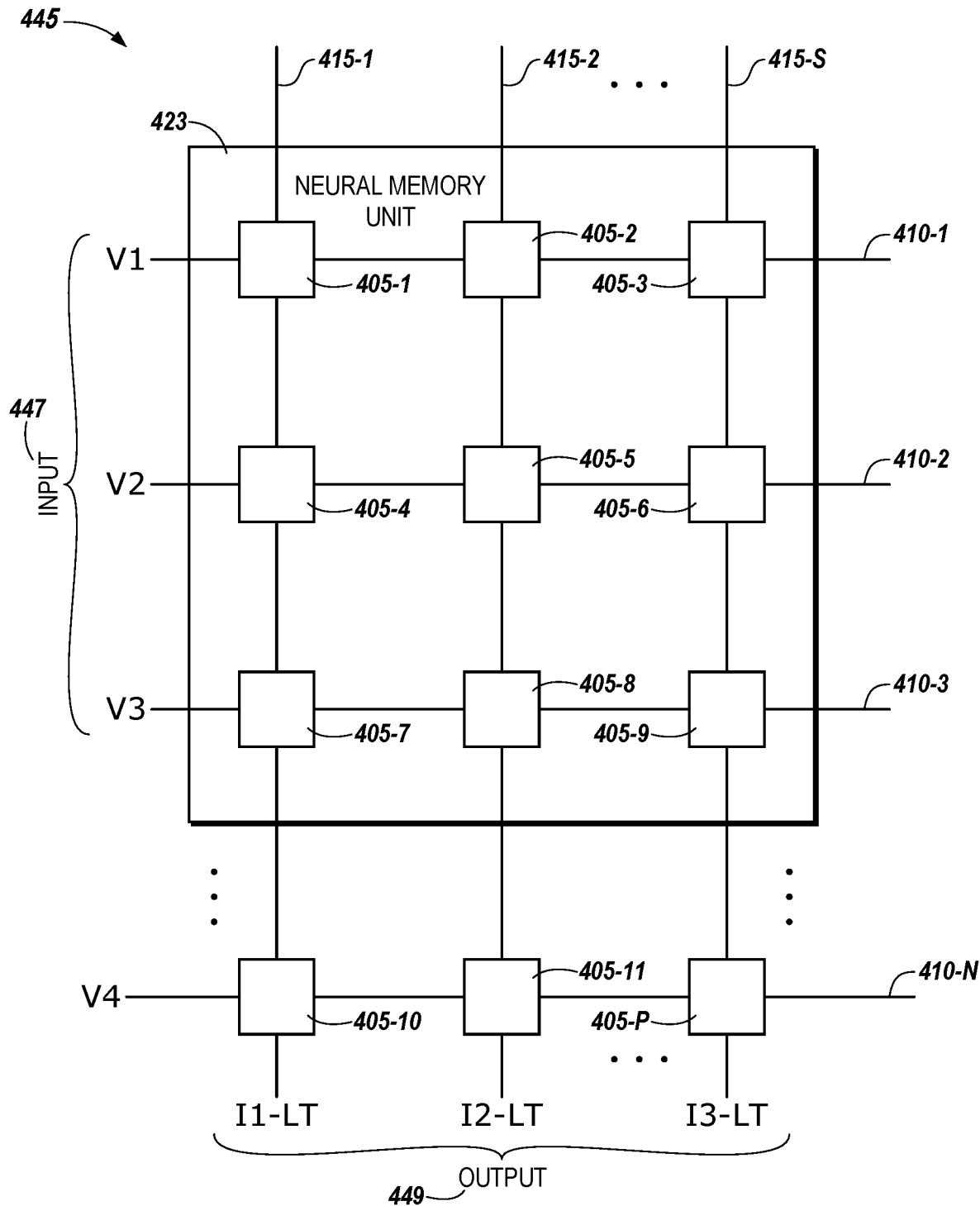
FIG. 4B illustrates an example of a memory array that shows features of an operation on a plurality of memory cells that support weight storage for long-term memory learning using a memory device in accordance with embodiments of the present disclosure.

FIG. 4B illustrates an example of a memory array 445 that shows features of a read operation of a plurality of memory cells 405 that supports weight storage for long-term memory learning using a memory device in accordance with embodiments of the present disclosure. The memory array 445 may be an example of the memory array 303 with reference to FIG. 3. The memory array 445 may include a plurality of memory cells 405. The plurality of memory cells 405 may be coupled to a plurality of sense lines 415-1, 415-2, . . . , 415-S (hereinafter referred to collectively as plurality of sense lines 415) and a plurality of access lines 410-1, 410-2, 410-3, . . . 410-N (hereinafter referred to collectively as plurality of access lines 410).

Prior to performing the plurality of long-term memory operations, a plurality of forced write cycle operations can be performed on the memory array 445 to irreversibly degrade the cells of the memory array 445. The irreversible degradation of the cells enables the cells to perform as long-term memory operations. The plurality of forced write cycle operations can increase a conductivity of the memory cells of memory array 445, representing an increase in the synaptic weight during long-term memory operations performed subsequent to the forced write cycling operations. In contrast, cells of memory array 401 illustrated in FIG. 4A, which have not experienced forced write cycling prior to performing the neural network operations, will initially have a lower conductance, representing a lower synaptic weight. The cells of the memory array 401 illustrated in FIG. 4A can therefore perform as short-term memory cells.

The controller may detect an output 449 that includes one or more signals generated on one or more sense lines 415 coupled with the plurality of memory cells 405. The output 449 on the sense lines 415 may be generated based on applying the input 447 to the access lines 410 coupled with the plurality of memory cells 405. As an example, the input 447 can be a particular voltage applied to a cell 405 and, in response to the particular voltage being at least the threshold voltage of the cell 405, the cell 405 can generate an output signal that is sent along sense lines 415 and as one of the current signals. For example, the signals of the output 449 may comprise current signals (e.g., I1-LT, I2-LT, I3-LST).

The current signals I1-LT, I2-LT, and I3-LT can be current signals that result from long-term memory learning. As an example, a number of forced write cycles greater than 10,000 cycles can be performed on the memory cells 405 prior to the long-term memory operations being performed, thereby resulting in a higher conductance from the long-term memory operations than if the cells were short-term memory cells, as will be further described in association with FIGS. 5-6B.

Short-term (ST) memory learning, as described in association with FIG. 4A, and long-term (LT) memory learning, as described in association with FIG. 4B, can be performed by using the analog current readouts of the outputs (I1-ST, I2-ST, I3-ST) 443 for short-term memory learning in FIG. 4A and outputs (I1-LT, I2-LT, I3-LT) 449 for long-term memory learning in FIG. 4B.

In some examples, data stored in a cell of a first portion (e.g., a short-term memory cell) can be transferred to be stored in a second portion in response to an output current vector of short-term memory learning (e.g., the vector I1-ST, I2-ST, I3-ST) being above a particular current threshold. As an example, the memory learning can be indicated as switching from short-term to long-term memory learning. Thus, a weight pattern related to short-term memory learning can be moved from a short-term memory array to a long-term memory array if: I1-ST>I(threshold), I2-ST>I(threshold), I3-ST>I(threshold). After long-term potentiation (such as performing greater than 10,000 forced write cycles on memory cells of an array), I1-LT>I1-ST, I2-LT>I1-ST, I3-LT>I3-ST. Put another way, in response to an indication that learning between memory cells has increased above a particular threshold, data stored in memory cells associated with short-term learning (e.g., those cells described in FIG. 4A and associated with a first portion 122 of memory array 130 in FIG. 1) can be transferred to memory cells associated with long-term learning (e.g., those cells described in FIG. 4B and associated with a second portion 124 of memory array 130 in FIG. 1).

A short-term potentiation (associated with short-term memory learning) can be associated with an analog voltage decrease (conductance increase) in low seasoning areas of an array (e.g., 100-1,000 write cycles), thus featuring a reversible conduction increase starting from a RESET preconditioning, as will be described in association with FIGS. 5 and 6B. The short-term potentiation can be enabled by reversible degradation mechanisms, like read pulsing (RESET read disturb) using SSM technology or short SET pulsing using 3D cross-point.

A long-term potentiation (associated with long-term memory learning) can be associated with an irreversible voltage decrease (conductance increase) by seasoning of an array after 10,000-100,000+ write cycles. In this instance, patterns obtained using short-term memory learning can be further potentiated by an irreversible degradation mechanism, thereby switching a short-term memory cell to a long-term memory cell. The further potentiation can be enabled by forced write cycling to irreversibly lower a SET voltage, as will be described in association with FIG. 6A.

FIG. 5 illustrates an example of a graph 556 of the threshold voltage for a memory cell of a three-dimensional (3D) cross-point memory array in accordance with embodiments of the present disclosure. The graph 556 illustrates how a number of cycles affects a voltage of a cell for each of a RESET state 551 and a SET state 553.

The graph 556 illustrates threshold voltage 555 along the y-axis and a number of cycles 557 along the x-axis. The threshold voltage 555 is illustrated in arbitrary units and does not necessarily demonstrate an actual threshold voltage but does demonstrate an increase or decrease in the threshold voltage. The interval 552 between 0 cycles and 100 cycles is associated with a short-term memory learning phase. The interval 554 beyond 10,000 cycles is associated with a long-term memory learning phase. A conductance of the memory cell during the short-term memory learning can be lower (indicated by the greater threshold voltage) than during the long-term memory learning phase. The interval between the short-term memory learning phase (interval 552) and the long-term memory learning phase (interval 554) refers to an interval that leads to an irreversible increase in conductance. As the number of cycles 557 increases, the threshold voltage 555 of the memory cell decreases, indicating an increase in conductance as an increasing number of cycles are performed on the memory cell. This increase in conductance is indicative of an increased learning and can represent an increase in synaptic weight.

In one example, the interval 552 indicative of short-term memory learning can illustrate results of performing short-term memory operations on short-term memory cells (e.g., the first portion 122 in FIG. 1) and the interval 554 indicative of long-term memory learning can illustrate results of performing long-term memory operations on long-term memory cells (e.g., the second portion 124 in FIG. 1).

FIG. 6A illustrates an example of a graph 666 showing the threshold voltage for a self-selecting (SSM) memory cell in a SET state in accordance with embodiments of the present disclosure. The plot indicated by 661 is for a positive polarity read. The plot indicated by 663 is for a negative polarity read.

The graph 666 illustrates the threshold voltage 665 of the memory cell along the y-axis and a number of cycles 667 performed along the x-axis. The threshold voltage 665 is illustrated in arbitrary units and does not necessarily demonstrate an actual threshold voltage but does demonstrate an increase or decrease in the threshold voltage. The interval 662 between 0 cycles and 100 cycles is associated with a short-term memory learning phase. The interval 664 beyond 10,000 cycles is associated with a long-term memory learning phase. A conductance of the memory cells during the short-term memory learning can be lower than during the long-term memory learning phase. The interval between the short-term memory learning phase (interval 662) and the long-term memory learning phase (interval 664) refers to an interval that leads to an irreversible increase in conductance. As the number of cycles 667 increases, the threshold voltage of the memory cells decreases, indicating an increase in conductance. This increase in conductance is indicative of an increased learning and can represent an increase in synaptic weight.

FIG. 6B illustrates an example of a graph 676 showing the threshold voltage for a self-selecting (SSM) memory cell in a RESET state in accordance with embodiments of the present disclosure. The plot indicated by 671 is for a negative polarity read. The plot indicated by 673 is for a positive polarity read.

The graph 676 illustrates the threshold voltage 675 of the memory cell along the y-axis and a number of cycles 677 along the x-axis. The threshold voltage 675 is illustrated in arbitrary units and does not necessarily demonstrate an actual threshold voltage but does demonstrate an increase or decrease in the threshold voltage. The interval 672 between approximately 0 cycles and 100 cycles is associated with a short-term memory learning phase. The interval 674 beyond approximately 10,000 cycles is associated with a long-term memory learning phase. A conductance of the memory cells during the short-term memory learning can be lower than during the long-term memory learning phase. The interval between the short-term memory learning phase (interval 672) and the long-term memory learning phase (interval 674) refers to an interval that leads to an irreversible increase in conductance. As the number of cycles 677 increases, the threshold voltage 675 of the memory cells decreases, indicating an increase in conductance. This increase in conductance is indicative of an increased learning among the memory cells and can be an increase in synaptic weights between the memory cells.

Figure 7:
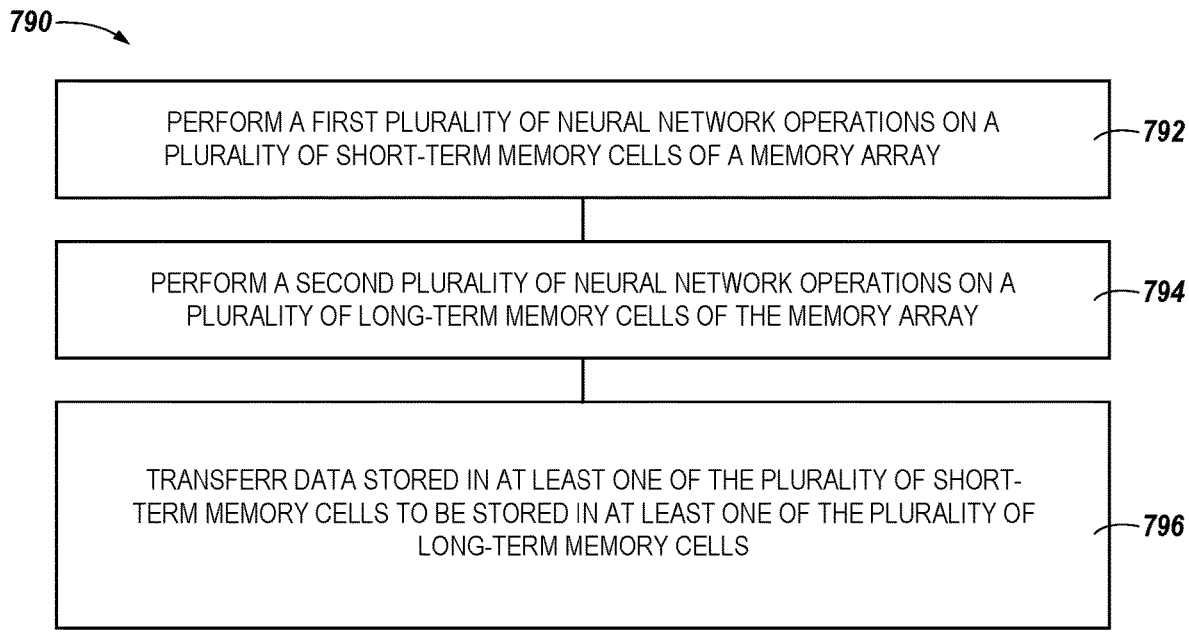
FIGS. 7-8 illustrate methods for short-term or long-term learning memory storage using a memory device in accordance with embodiments of the present disclosure.

FIG. 7 illustrates an example method 790 for short-term and long-term learning memory storage using a memory device in accordance with embodiments of the present disclosure. Method 790 may be implemented by a controller (e.g., controller 140 in FIG. 1) or its components as described herein. In some examples, a controller may execute a set of codes to control the functional elements of the device to perform the functions described below. The controller may perform aspects of the functions described below using hardware and/or firmware.

At 792, the method can include performing a first plurality of neural network operations on a plurality of short-term memory cells of a memory array. The controller may cause the neural network operations to be performed on the short-term memory cells. The neural network operations can be short-term memory operations that mimic biological short-term memory learning.

At 794, the method 790 can include performing a second plurality of neural network operations on a plurality of long-term memory cells of the memory array. The controller may cause the neural network operations to be performed on the long-term memory cells. The neural network operations can be long-term memory operations that mimic biological long-term memory learning.

At 796, the method 790 can include transferring data stored in at least one of the plurality of short-term memory cells to be stored in at least one of the plurality of long-term memory cells in response to the data being associated with a synaptic weight being transitioned from short-term memory to long-term memory. As an example, the short-term memory cell can indicate a synaptic weight that has since changed to an increased synaptic weight and therefore the data in the short-term memory cell can be transferred to a long-term memory cell to indicate that increased synaptic weight.

Figure 8:
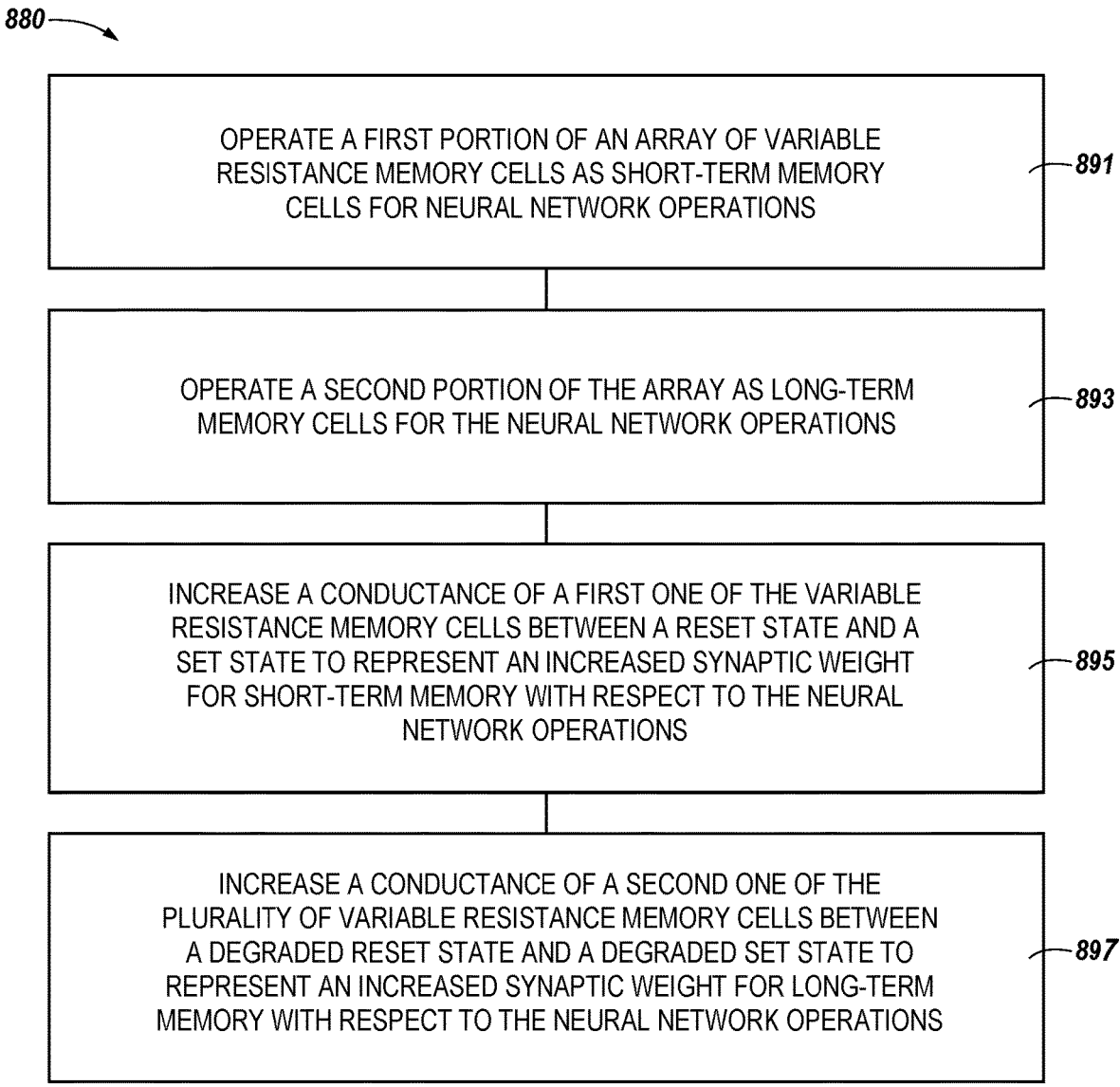

FIG. 8 illustrates an example method 880 for short-term and long-term learning memory storage using a memory device in accordance with embodiments of the present disclosure. Method 880 may be implemented by a controller (e.g., controller 140 in FIG. 1) or its components as described herein. In some examples, a controller may execute a set of codes to control the functional elements of the device to perform the functions described below. The controller may perform aspects of the functions described below using hardware and/or firmware.

At 891, the method 880 can include operating a first portion of an array of variable resistance memory cells as short-term memory cells for neural network operations. The operation of the first portion of the array of variable resistance memory cells as short-term memory cells can include operating the short-term memory cells with reversible degradation based on the number of operations performed.

At 893, the method 880 can include operating a second portion of the array as long-term memory cells for the neutral network operations. The operation of the second portion of the array can include operating the long-term memory cells with irreversible degradation based on the number of operations performed.

At 895, the method 880 can include increasing a conductance of a first one of the variable resistance memory cells between a reset state and a set state to represent an increased synaptic weight for short-term memory with respect to the neural network operations. At 897, the method 880 can include increasing a conductance of a second one of the plurality of variable resistance memory cells between a degraded reset state and a degraded set state to represent an increased synaptic weight for long-term memory with respect to the neural network operations.

It should be noted that the methods described above describe possible implementations, and that the operations and the steps may be rearranged or otherwise modified and that other implementations are possible. Furthermore, embodiments from two or more of the methods may be combined.

The devices discussed herein, including memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed:

1. An apparatus, comprising:
   a memory array comprising:
      a portion comprising a plurality of variable resistance memory cells that have been degraded through forced write cycling; and
   a memory controller coupled to the portion, wherein the memory controller is configured to:
      operate the portion for long-term memory operations; and
      perform the forced write cycling on the plurality of variable resistance memory cells prior to operating the portion.

2. The apparatus of claim 1, wherein the memory array comprises an additional portion comprising an additional plurality of variable resistance memory cells.

3. The apparatus of claim 2, wherein the memory controller is configured to operate the additional portion for short-term memory operations.

4. The apparatus of claim 1, wherein the memory controller is configured to operate the portion for long-term memory operations by applying a pulse to increase a conductance of any of the plurality of variable resistance memory cells while in a RESET state.

5. The apparatus of claim 4, wherein the RESET state of any of the plurality of variable resistance memory cells is a greater conductance than a RESET state of an additional plurality of variable resistance memory cells associated with short-term memory operations.

6. The apparatus of claim 5, wherein increasing the conductance represents an increase to a long-term synaptic weight.

7. The apparatus of claim 1, wherein the memory controller configured to perform the forced write cycling comprises the memory controller configured to perform at least 10,000 forced write cycles.

8. The apparatus of claim 1, wherein the memory controller configured to perform the forced write cycling comprises the memory controller configured to cause the plurality of variable resistance memory cells to be in a degradation condition.

9. The apparatus of claim 8, wherein the degradation condition of the plurality of variable resistance memory cells is greater than a degradation condition of an additional plurality of variable resistance memory cells for short-term memory operations.

10. The apparatus of claim 1, wherein the memory controller configured to perform the forced write cycling comprises the memory controller configured to irreversibly increase a conductance associated with each of the plurality of variable resistance memory cells.

11. An apparatus, comprising:
    a memory array comprising a portion comprising a plurality of variable resistance memory cells; and
    a memory controller coupled to the portion, wherein the memory controller is configured to:
       operate the portion for short-term memory operations; and
       reclassify a particular one of the plurality of variable resistance memory cells as one of a different plurality of variable resistance memory cells in response to an operating criterion being met.

12. The apparatus of claim 11, wherein the different plurality of variable resistance memory cells are used for long-term memory operations.

13. The apparatus of claim 11, wherein at least a subset of the different plurality of variable resistance memory cells has been degraded through forced write cycling.

14. The apparatus of claim 13, wherein the memory controller is configured to perform the forced write cycling on the different plurality of variable resistance memory cells prior to operating the different plurality of variable resistance memory cells for long-term memory operations.

15. The apparatus of claim 11, wherein the memory controller is configured to operate the portion for short-term memory operations by resetting the conductance of any of the plurality of variable resistance memory cells.

16. The apparatus of claim 11, wherein the memory controller configured to operate the portion for short-term memory operations comprises the memory controller configured to perform fewer than 1000 short-term memory operations on any of the plurality of variable resistance memory cells.

17. A method, comprising:
performing a first plurality of neural network operations on a plurality of short-term memory cells of a memory array;
performing a second plurality of neural network operations on a plurality of long-term memory cells of the memory array, and
transferring data stored in at least one of the plurality of short-term memory cells to be stored in at least one of the plurality of long-term memory cells.

18. The method of claim 17, wherein the data represents a synaptic weight with respect to the first plurality of neural network operations.

19. The method of claim 17, wherein transferring the data comprises one of transferring the data in response to:
the first plurality of neural network operations indicating that long-term learning has occurred; or
the synaptic weight being above a threshold synaptic weight.

20. The method of claim 17, wherein performing the first plurality of neural network operations comprises changing data stored in the first plurality of short-term memory cells corresponding to an increase in the synaptic weight with respect to the first plurality of neural network operations.

* * * * *